(12) United States Patent
Ogura et al.

(10) Patent No.: US 9,076,906 B2
(45) Date of Patent: Jul. 7, 2015

(54) HETERO-JUNCTION BIPOLAR PHOTOTRANSISTOR WITH IMPROVED NOISE CHARACTERISTIC

(75) Inventors: Mutsuo Ogura, Tsukuba (JP);
SungWoo Choi, Tsukuba (JP);
Nobuyuki Hayama, Tsukuba (JP);
Katsuhiko Nishida, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 182 days.

(21) Appl. No.: 13/138,410

(22) PCT Filed: Feb. 12, 2010

(86) PCT No.: PCT/JP2010/052485
§ 371 (c)(1),
(2), (4) Date: Aug. 11, 2011

(87) PCT Pub. No.: WO2010/093058
PCT Pub. Date: Aug. 19, 2010

(65) Prior Publication Data
US 2011/0291158 A1    Dec. 1, 2011

(30) Foreign Application Priority Data

Feb. 13, 2009  (JP) ................ 2009-031235
Feb. 13, 2009  (JP) ................ 2009-031236

(51) Int. Cl.
*H01L 31/102* (2006.01)
*H01L 31/0304* (2006.01)
*H01L 31/11* (2006.01)

(52) U.S. Cl.
CPC ...... *H01L 31/03046* (2013.01); *H01L 31/1105* (2013.01); *Y02E 10/544* (2013.01)

(58) Field of Classification Search
CPC ... H01L 31/03046; H01L 31/10; H01L 31/11; H01L 31/1105
USPC ............. 257/184, 186, 187, 189, 428, 431
See application file for complete search history.

(56) References Cited

U.S. PATENT DOCUMENTS 6,049,099 A * 4/2000 Vaccaro et al. ............ 257/200
7,038,254 B2 * 5/2006 Yanagisawa ................ 257/197

(Continued)

FOREIGN PATENT DOCUMENTS

JP   2008-227328   9/2008

OTHER PUBLICATIONS

Applied Physics Letters 89, 151109 (2006); nBn detector, an infrared detector with reduced dark current and higher operating temperature; pp. 89, 151109-1 to 151109-3, 2006 American Institute of Physics.

(Continued)

*Primary Examiner* — Jay C KIm
(74) *Attorney, Agent, or Firm* — Manabu Kanesaka

(57) ABSTRACT

A hetero-junction bipolar phototransistor includes a photo-absorption layer formed of a first conductivity type semiconductor layer, and a collector operating as a barrier layer, a base layer, and an emitter layer, which are stacked in sequence on the photo-absorption layer. The photo-absorption layer, collector, base layer and emitter layer forms a first mesa structure, and an emitter contact layer forms a second mesa structure. The photo-absorption layer includes a semiconductor layer with a narrow gap corresponding to a light-sensing wavelength of the phototransistor. The collector includes a semiconductor layer with a wider gap than a gap of the photo-absorption layer. The base layer has an energy level equal to or higher than the energy level of the collector. The emitter layer has a wide gap as compared to the base layer, and an energy level in a valence band is lower than an energy level of the base layer.

1 Claim, 14 Drawing Sheets

(56) References Cited

U.S. PATENT DOCUMENTS

| | | | |
|---|---|---|---|
| 7,705,361 B2* | 4/2010 | Wang et al. | 257/76 |
| 8,415,713 B2* | 4/2013 | Ogura | 257/187 |
| 2006/0065952 A1 | 3/2006 | Boos et al. | |
| 2008/0308840 A1* | 12/2008 | Ogura | 257/185 |

OTHER PUBLICATIONS

IEEE Photonics Technology Letters, vol. 18, No. 16, Aug. 15, 2006; Room-Temperature InAsSb Photovoltaic Detectors for mid-Infrared Applications; H. Shao, W.Li, A. torfi, D.Moscicka, and W.I. Wang, Fellow, IEEE.

InP/GaAsSb/InP and InP/GaAsSb/InGaAsP double heterojunction bipolar transistors with a carbon-doped base grown by organometallic chemical vapor deposition; R. Bhat, W-P. hong, C. Caneau, M.A. koza, C-K. nguyen, and S. Goswami.

InP/GaAsSb/InP Double HBTs: A New Alternative for InP-Based DHBTs; IEEE Transactions on Electron Devices, vol. 48, No. 11, Nov. 2001.

AlGaAsSb-InGaAsSb HPTs With High Optical Gain and Wide Dynamic Range; M. Nurul Abedin, Member; IEEE, Tamer F. Refaat, member, IEEE, Oleg V. Sulima, and Upendra N. Singh, Member, IEEE.

2.4-μm-Cutoff AlGaAsSb/InGaAsSb Phototransistors for Short-wave-IR Applications; Tamer F. Refaat, M. Nurul Abedin, Oleg V. Sulima, Syed Ismail, and Upendra N. Singh.

High performance InP/InAlAs/GaAsSb/InP double heterojunction bipolar transistors; S.W. Cho, J.H. yun, D.H. Jun, J.I. Song, I.Adesida, N. Pan, J.H. Jang; Apr. 13, 2006.

* cited by examiner

HETERO-JUNCTION BIPOLAR PHOTOTRANSISTOR WITH IMPROVED NOISE CHARACTERISTIC

RELATED APPLICATIONS

The present application is National Phase of International Application No. PCT/JP2010/052485 filed Feb. 12, 2010, and claims priority from, Japanese Applications No. 2009-031235, filed Feb. 13, 2009 and No. 2009-031236, filed Feb. 13, 2009, the disclosure of which is hereby incorporated by reference herein in its entirety.

TECHNICAL FIELD

The present invention relates to a photo detection device, or a photodetector. In particular, it relates to an improvement of a hetero-junction bipolar phototransistor (HPT) comprising a compound semiconductor system.

BACKGROUND TECHNOLOGY

Photodetectors, and one or two dimensional photodetector arrays comprising a compound semiconductor system having sensitivity in the near ultraviolet and the infrared regions that silicon detectors can not cover have broad demand in fields such as sensing devices for optical communications, spectroscopic systems, or as infrared cameras for medical treatment, disaster prevention, industrial inspection and others.

Especially in the recent years, development of a highly sensitive photodetector is strongly demanded for the infrared region where basic absorption bands exist in the environmental gases such as carbon monoxide, carbon dioxide, nitrous oxide and methane. The infrared detector in this wavelength band becomes important more and more as applications, such as air pollution surveillance, measures for global warming, disaster prevention, and reducing fuel consumption by combustion gas monitoring. Although infrared detectors made with an HgCdTe system have been manufactured for these applications, this material is a source of pollution so that the quantity of production and its usage have been regulated. Therefore, the infrared detector with a safer material is in demand. Also, infrared detectors using narrow gap semiconductors such as an InSb system have shown large dark current caused by thermal excitation or surface leak, which is the main reason for the dark current noise that limits the detection sensitivity. Therefore, in the application which requires high sensitivity, the device needs to be cooled less than −120 degrees Centigrade with liquid nitrogen or large size equipment such as a mechanical cooler in order to reduce the dark current.

Various contrivances have been made in order to suppress the dark current in a narrow gap semiconductor. As indicated by the well-known SRH (Shockley-Read-Hall) statistics, electron-hole pairs are generated when the product of electron and hole concentration are smaller than that of a thermal equilibrium state, and electron-hole pairs are recombined when the product is larger than that of a thermal equilibrium state. Moreover, in the case of a depletion state, a semiconductor of a narrow band gap exhibits higher carrier generation speed due to its large intrinsic carrier concentration. Therefore, in order to control dark current in the narrow band gap semiconductor for middle-infrared detection, it is important to make the depletion region small wherein electron-hole pairs are generated.

As the following document 1 discloses, an antimony system middle-infrared photodetector has so-called nBn structure, where a semiconductor layer with a large band gap is inserted between a photo-absorption layer of an n-type semiconductor with a narrow band gap and an n-type contact layer with the same narrow band gap in order to control dark current.

Document 1: S. Maimon and G. W. Wicks and "nBn detector, an infrared detector with reduced dark current and higher operating temperature" APPLIED PHYSICS LETTERS vol. 89, October 2006, p. 151109."

In this structure, the dark current is suppressed as the current induced by electron majority carriers is blocked with the barrier formed in the conduction band of the larger band gap layer, and valence band barriers of all semiconductor which constitute a photodiode (PD) can be eliminated and the band offset in the valence band can be made almost flat so that only the photo excited hole current is effectively retrieved as a photo-induced current.

Also, document 2 shows the structure intending to detect infrared efficiently even in 4 μm wavelength region at room temperature, where a large band gap such as InAlAsSb is adopted for the surface barrier layer, and the discontinuity of a valence band in the boundary with the photo-absorption layers such as InAsSb is eliminated so that holes generated by light irradiation are captured efficiently.

Document 2: H. Shao, W. Li, A. Torfi, D. Moscicka, and W. I. Wang, "Room-Temperature InAsSb Photovoltaic Detectors for Mid-Infrared Applications", IEEE PHOTONICS TECHNOLOGY LETTERS, VOL. 18, No. 16, August 15, and (2006) p. 1756-1758.

In addition, the inventors' separate research has revealed that the dark current of a mesa type photodiode with excellent isolation characteristics equivalent to a planar type can be made, where the mesa surface has the same electric conduction type and the pn junction formed with a narrow band gap material is not exposed to the mesa surface.

These photodiodes are simple in the operation mechanism and excellent in quantitative measurement, however, only single electron-hole pair is generated per photon at maximum, thus, the current output is too small to detect very weak light and there is a problem that the detectivity is limited by the noise characteristics of an electric amplifier connected to the photodiode. Therefore, a phototransistor having internal amplification function has been developed as a compound semiconductor photodetector. The hetero-junction bipolar phototransistors (HPT), which amplifies photocurrent by changing the potential of the base with the holes generated from the photon, has less noise than an avalanche photodiode (APD) having a similar amplifying effect of photocurrent and has been researched and developed continuously from the 1980s until now as a highly sensitive detector.

A phototransistor usually has its base-collector junction to serve as a photodiode, and by injecting photocarriers generated in the collector region into the base, the base is biased to the forward direction as in a bipolar transistor. Therefore, the characteristics of HPT are determined by the characteristics of a photodiode (PD) and a hetero-bipolar transistor (HBT), and by those electric connection methods so that optimally designing these structural elements is necessary.

When the HPT structure is implemented by the multiple layer epitaxial growth, emitter base layers or base collector layers are made into a mesa structure for isolation. According to the inventors' research findings described previously, enhancement of the current gain of the transistor and the suppression of dark current are simultaneously achieved by turning the mesa surface regions of each layer into common electric conduction type. Moreover, according to the inventors' other research findings, the dark current of the PD section can be suppressed even in a stacked DH (Double Hetero) type HBT and a planar type PD made by selective impurity diffusion.

In a heterojunction bipolar transistor (HBT) used as an electron device, an emitter material can be made so as to have a larger band gap relatively to a base material, and to make the energy level of a valence band of the emitter lower than that of the base. In other words, leakage of holes from the base to the emitter can be blocked as holes encounter the electrostatic potential barrier in the emitter interface, which in turn, produces large current gain. Furthermore, in order to improve the breakdown voltage of a transistor, the DH type HBT using a material having a comparatively wide band gap as a collector is also being developed.

In order to extend the sensitive wavelength range of a phototransistor, it is common to make the energy band gap of the collector small so as to correspond to the wavelength band to be used. However, the problem occurs that the breakdown voltage between the emitter and the collector drops because the electric field concentrates on the base collector junction. In general, the breakdown voltage of semiconductor material drops as its band gap is narrowed so that it is disadvantageous to use a narrow gap material having an absorption edge in a long wavelength region as a collector.

On the other hand, in a DH type HBT, which is advantageous from the viewpoint of breakdown voltage, the electron transfer from the base to the collector is obstructed since the conduction band level of the collector becomes higher than that of the base. Moreover, when the photo-absorption layer corresponding to the detecting wavelength is formed under the collector layer having a relatively large energy band gap, the energy level of the valence band of the photo-absorption layer becomes lower than that of the collector, and a path reaching the base from the photo-absorption layer through photo-generated holes is blocked. Therefore, a DH type HBT is not suitable as a phototransistor for detecting very weak light.

In the case of a phototransistor, having a high current amplification factor is required in order to amplify the photo-induced current of the sub pA level corresponding to absorbed photons even for the very small base current. Moreover, in a photodetector, cooling a device is generally performed in order to control the dark current. Under the conditions of such very small bias current and a low-temperature operation, a new design of a band profile is essential because the small discontinuity in the band profile obstructs the transfer of electrons and holes, which was not a concern for a conventional HBT intending to amplify large current.

In III-V compound semiconductors, it is possible to design potentials of the conduction band and the valence band independently by arranging the composition ratio of the constitutional elements. Especially, a compound semiconductor containing antimony has a tendency of a conduction-band level to become high as its electron affinity is small. For example, it is possible to design the conduction band of a base layer higher than an InP collector and also to make the valence band of a base layer higher than an InP emitter, by replacing a GaAsSb lattice-matched to InP with an InGaAs base for the InP system DH-HBT. See the following documents 3 and 4 concerning this point.

Document 3: R. Bhat, W-P. Hong, C. Caneau, M. A. Koza, C-K. Nguyen, and S. Goswami and "InP/GaAsSb/InP and InP/GaAsSb/InGaAsP double heterojunction bipolar transistors with a carbon-doped base grown by organometallic chemical vapor deposition", Applied Physics Letters vol. 68 (7), February 1996 pp. 985-987.

Document 4: C. R. Bolognesi, N. Matine, Martin W. Dvorak, P. Yeo, X. G. Xu, and Simon P. Watkins, "InP/GaAsSb/InP Double HBTs: A New Alternative for InP-Based DHBTs", IEEE TRANSACTIONS ON ELECTRON DEVICES, VOL. 48, No. 11, November 2001 pp. 2361-2639.

In the following document 5, it is proposed to make electron transfer smooth with an antimony system compound semiconductor, by lowering step-wise conduction bands of an emitter, a base, and a collector, and by matching the potential of each boundary.

Document 5: U.S. Patent Publication No. 2006/0065952

In InGaAs formed on an InP substrate, the sensitive wavelength of about 2.2 µm is the practical limit even if the In composition is increased and a certain amount of lattice mismatch is allowed. When a photo-absorption layer is formed with antimony system semiconductors, such as GaSb, InGaSb, and InAsSb, the photodetection wavelength can be extended to about 2.8 µm with an InGaSb photo-absorption layer, and about 5 µm with an InAsSb photo-absorption layer. Even in a HPT, the design concept similar with an electron device HBT is applied to make small the band offset of the conduction band between an emitter and a bases, and also to make large the band offset of a valence band in order to obtain a large amplification action. As for a middle-infrared photo-detector, as described in the following documents 6 and 7, an AlGaAsSb/InGaAsSb system HPT formed on a GaSb substrate produces gain from 500 A/W to 1000 A/W at near room temperature. However, since the collector serves as the photo-absorption layer, the detection wavelength can be up to 2.5 µm band at most.

Document 6: M. Nurul Abedin, Tamer F. Refaat, Oleg V. Sulima, and Upendra N. Singh, "AlGaAsSb—InGaAsSb HPTs With High Optical Gain and Wide Dynamic Range", IEEE TRANSACTIONS ON ELECTRON DEVICES, VOL. 51, No. 12, December 2004, p. 2013-2018.

Document 7: Tamer F. Refaat, M. Nurul Abedin, Oleg V. Sulima, Syed Ismail, and Upendra N. Singh, "2.4-µm-Cutoff AlGaAsSb/InGaAsSb Phototransistors for Shortwave-IR Applications", IEEE TRANSACTIONS ON ELECTRON DEVICES, VOL. 54, No. 11, November 2007 p. 2837-2842.

Since the above-mentioned antimony system compound semiconductor is a high mobility material and has attracted attention as an ultra high-speed electron device application for the terahertz band. In an HBT, the band gap of a base layer determines theoretical amplitude so that the AlSb/GaSb/InAs system material having a large band offset and containing high mobility narrowband-gap materials has been drawn attention since. In particular, replacing the base layer of AlGaAs/GaAs system or InP/InGaAs system with GaAsSb to remove the notch of a conduction band in the HBTs (see the above-mentioned Documents 3 and 4), and also in the inventors' another experiments, using an InGaSb as a base layer and InAlAsSb as an emitter layer and collector layer in order to lower a theoretical amplitude than in an InGaAs/InP system HBT has been attempted. In this case, particular attention is also required for the composition selection of a collector material to remove the notch in the boundary of conduction band of a base collector in order to reduce theoretical amplitude and to lower power consumption.

However, by using a narrow band gap semiconductor as a base layer, the recombination effect caused by the Auger effect increases and the breakdown voltage drops. In the conventionally disclosed Document group, there is no disclosure to particularly note when an HPT is operated as a middle-infrared photodetector.

Since an infrared phototransistor has the structure where the transistor region is stacked on the photodiode region, it is necessary to meet the following 3 conditions simultaneously: (a) control of the dark current to improve a photodiode detectivity, (b) transfer of the photo-generated electric charge, and (c) reservation of the transistor current amplification effect.

That is, firstly, in order to extend the photodetection wavelength to a long wavelength band in a phototransistor, (1) it is necessary to control the dark current of the PD section being used as a photo-absorption layer. For that purpose, it is necessary to have such a structure where the pn junction of a narrowband gap semiconductor does not expose at the surface of a PD. Moreover, in order to control the dark current generated inside a bulk, it is also effective to form a potential barrier in a conduction band to block the electron current component.

Secondly, (2) the potential barrier in the valence band through a photo-absorption layer to a base layer is removed as oppose to the photo-generated hole, the charge generated in the PD section is duly transported to the transistor region. In other words, it is necessary to make a barrier-free profile.

Furthermore, (3) in a transistor region, it is necessary to have such a structure where a large current gain can be obtained corresponding to very small base current. For that purpose, (3-1) the surface recombination is suppressed in an end surface of the emitter base junction, (3-2) the potential barrier of sufficient height is formed for a valence band in the emitter base junction, (3-3) there is no potential barrier which obstructs the electron transfer in the conduction band from the base to the collector, in other words, it is necessary to make a barrier-free profile. (3-4) The ON voltage between the emitter and base should not be excessive for the operating temperature range of the device. (3-5) Moreover, in the practical environment, it is required that the reverse breakdown voltage should be large enough.

When overlapping a collector layer with a photo-absorption layer, it is necessary to narrow the band gap of a collector layer corresponding to a detecting wavelength. On the other hand, in order to increase the reverse breakdown voltage between a base and collector, it is necessary to expand band gaps that form the material for a base layer and a collector layer to some extent. Therefore, in order to make an HPT of which the breakdown voltage is large enough in the middle-infrared area, it is necessary to separate the photo-absorption layer and the collector layer, and to use a comparatively large band gap material for a collector layer.

However, the conventional DH type HBT which uses a comparatively large band gap material for a collector layer has an insufficient current gain for a very small current, and is not suitable for application to a HPT. Also, it is necessary to transfer the holes from the photo-absorption layer to the collector interface smoothly.

Also, when the conduction band of the collector layer is higher than the base, the hetero barrier formed in the collector base boundary reduces the electron injection efficiency. The barrier of the conduction band generated in such a collector interface obstructs the electron transfer. Especially, it reduces the amplification action for weak current during the low-temperature operation.

DISCLOSURE OF THE INVENTION

The present invention is directed to a photo detection device, which can solve or alleviate the problems that the before-mentioned conventional devices have. The device can greatly suppress the noise generation resulting from dark current, especially in an HPT for detecting the middle-infrared spectral range and has a high sensitivity and furthermore an extensive wavelength band characteristics. Therefore, in general terms, the optimization of a transistor region and a photodiode region is performed using the device structure designing and the band gap engineering technique. That is, the optimal design of the energy profile of a conduction band and a valence band is carried out independently, and while transporting smoothly the photo carriers generated in a photodiode region to a transistor region, generation of the leakage current in peripheral is controlled.

Therefore, the present embodiment proposes a hetero-junction bipolar phototransistor wherein following characteristics are provided:

in the phototransistor, which has a photo-absorption layer formed by the first conductivity type semiconductor substrate and a transistor portion comprising a collector operating as a barrier layer, a base layer, and an emitter layer, which are stacked in sequence on the photo-absorption layer;

the above-mentioned collector and barrier layer wherein the energy level in the conduction band is higher than that of this photo-absorption layer, and the energy level in the valence band is mostly equal to or higher than that of this photo-absorption layer; comprises a relatively wider gap semiconductor layer than the photo-absorption layer;

the above-mentioned base layer, which is formed on the above-mentioned collector and barrier layer, is relatively a narrow gap as compared with the collector and barrier layers, and of which energy level in the conduction band is equal to or higher than that of the collector and barrier layers in the boundary with the collector and barrier layers;

the above-mentioned emitter layer, which is formed on the above-mentioned base layer, is relatively a wide gap as compared with the base layer; the energy level in the valence band comprises the above-mentioned first conductivity type semiconductor substrate, which is lower than that of the base layer.

Under the above-mentioned basic composition, the above-mentioned base layer may comprise the second conductivity type semiconductor layer of opposite polarity.

Another embodiment of the present invention proposes a hetero-junction bipolar phototransistor with the above-mentioned base layer wherein the central portion comprises the above-mentioned first conductivity type semiconductor substrate, but, the surrounding region comprising the hetero-junction bipolar phototransistor of the second conduct type of the opposite polarity compared to the central portion is proposed.

Furthermore, in the specific embodiment of the present embodiment, the following hetero-junction bipolar phototransistor is also presented; the above-mentioned photo-absorption layer and the above-mentioned collector operating as a barrier layer are formed in a mesa structure; the exposed sidewall region of the mesa structure is uniformly formed with the above first conduct type or the second conduct type of the opposite polarity to the first conduct type; and the hetero-junction bipolar phototransistor wherein the pn junction region constituted by the photo-absorption layer and the collector or the barrier layer is not exposed in the side surface.

As another embodiment of the present invention with different materials, if innovating the semiconductor composition, the following component elements are desirable: the above-mentioned photo-absorption layer with InGaAs, the above-mentioned collector and barrier layer with InGaAsPSb, the above-mentioned base layer with InGaAsPSb, the above-mentioned emitter layer with InP, or, the above-mentioned photo-absorption layer with InAs or InAsSb, the above-mentioned collector and barrier layer with InAlAsSb, the above-mentioned base layer InGaSb or InGaAsSb, and the above-mentioned emitter layer with InAlAsSb.

The device implemented by the present embodiment has the collector operating as the barrier layer as well, which is located between the photo-absorption layer and the base layer and has a wider gap than a photo-absorption layer, and the energy level in a valence band is mostly equal to or higher than that of the photo-absorption layer. This means that a photo-absorption layer and a collector operating as a barrier layer form a so-called Type-2 hetero-junction. This means that it injects the holes generated inside the photo-absorption layer into a base layer without a barrier, and lowers the potential of a base layer, and controls the electron injection from an emitter layer to a base layer. On the other hand, electrons coming from an emitter layer through a base layer and reaching a barrier layer are led to a photo-absorption layer without facing a barrier in a conduction band, if the predetermined bias voltage is applied.

Furthermore, even if a photo-absorption layer is composed of a narrowband-gap material, hole injection to a barrier layer from a photo-absorption layer under no light irradiation can be suppressed, for example, by making a photo-absorption layer n type and lowering the hole concentration in a thermal equilibrium state. On the other hand, the electron current generated in a collector operating as the barrier layer is suppressed because the collector operating as the barrier layer comprises a wideband gap semiconductor and the electron concentration in a thermal equilibrium state can be set low. In addition, the electric field in a photo-absorption layer is eased as much as the difference between the energy level in the conduction band of a photo-absorption layer and that of a collector operating as a barrier layer so that the generation of electron-hole pairs in a depletion region under no light irradiation is suppressed.

According to the present embodiment, if the junction of a collector operating as a barrier layer, and a photo-absorption layer becomes a Type 2 heterojunction, a potential slope from a collector operating as the barrier layer to a photo-absorption layer can be formed without a barrier as to electrons, and a potential slope from a photo-absorption layer to a collector or the barrier layer can be formed without a barrier as to holes, that is, a barrier-free structure can be formed in a conduction band and a valence band respectively. Electrons and holes flow in opposite directions and also they are separated to some extent in the planar configuration. Therefore, in an HPT of the present embodiment, an optimal design for each independent view is possible such as in terms of amplification rate, a base layer and an emitter layer as an electron device, and in terms of quantum efficiency, a photo-absorption layer and a collector operating as a barrier layer as a photodiode.

Concerning the structure of the transistor, enlarging the band gap of a collector layer in order to increase the breakdown voltage of a device is effective. However, in double hetero (DH) type HBT, the potential barrier in a conduction band is generated between a base and collector which makes amplification of a very small current difficult. However, concerning this point, the current amplification action at low temperature or for low illumination can be enhanced by matching the conduction energy level of a base layer to that of a collector region by applying the present embodiment and knowledge induced from the before-mentioned Documents 3 and 4. The base layer of a transistor region has a reverse polarity from an emitter layer and the ON voltage of a transistor is controlled by the built-in potential of a pn junction. In order to make a built-in potential low, it is required to make a band gap small. However, this increases carrier recombination and thermal generation of carriers or decreases breakdown voltage. Therefore, the ON voltage of the conventional npn or pnp type bipolar transistor tends to become excessive if the operating conditions were low temperature or low illumination. However, according to the specific embodiment of the present embodiment, the emitter layer formed on the base layer has a relatively wide gap as compared to a base layer, and the energy level in the conduction band is equal to or lower than that of a base layer in the boundary with a base layer. Therefore, the height of the barrier of the conduction band, which controls the carrier injected from an emitter layer, is independent from the energy band gap of base layer material. Then, if material with a comparatively large energy band gap is used for a base layer, it becomes possible to implement a comparatively small ON voltage. The potential of the conduction band of a base layer is controllable by reversing the surroundings of a base layer to p type and injecting holes from this p type layer.

In the conventional transistor amplifying circuits, it is common to wire a proper resistor between an emitter base and a base or a collector, and to design bias current and gain levels. However, in the case of HPT aiming at the very weak photo-detection of pW level, the range of the optimal resistor will need to be set to G ohm and may need to use special high resistor and circuit board. However, according to the present embodiment, it becomes possible to set up the bias conditions freely, and implementation to a device becomes easy as a two-terminal device by designing the potential of the conduction band of a base layer in the case of an open base HPT.

Generally, the surface defect density of a crystal is larger than the inside of a crystal, and the carrier recombination and the generation effects in crystal defective levels are proportional to an equilibrium carrier concentration. Therefore, in order to prevent the decrease of the transistor current gain caused by carrier recombination and increase of dark current by carrier generation, it is effective to form a pn junction exposed at the surface composed of a wideband gap semiconductor only, and to maintain its thermal equilibrium conditions as unique conductivity on a narrow band gap surface. The specific embodiment of the present embodiment also realizes such a dark current suppression mechanism.

An HPT of this present embodiment where a phototransistor elements is optimally designed by the arts of the band gap engineering and surface treatment becomes a wide range middle-infrared photodetection device with much higher sensitivity even under operating environment near room temperature and making dark current lower less than one tenth and amplification rate higher compared to the conventional middle-infrared photo detection device.

DETAILED DESCRIPTION OF PREFERRED EMBODIMENTS

Figure 1:
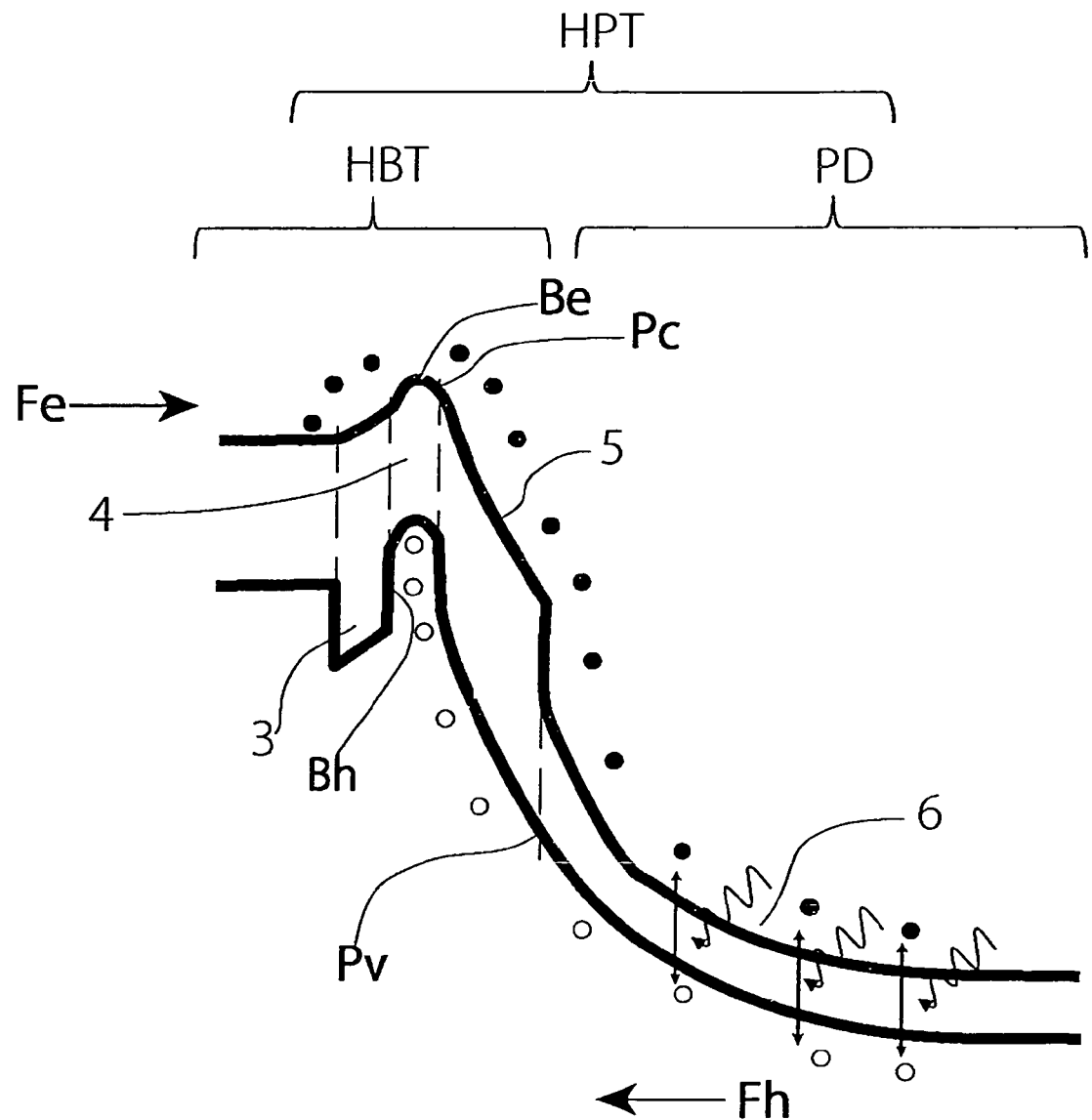
FIG. 1 is an explanatory view of the band profile of an HPT as preferred embodiment of the present invention.

The preferred embodiments of the present embodiment are provided in FIG. 1 and subsequent figures. Through all the figures, the same symbol and numbering correspond to the same or similar components. Therefore, in each explanation along with each Fig. among this specification, when there is no description of the component with symbols in the Fig., the description of the component with the same symbol provided in the other figures may be used alternatively.

Figure 12:
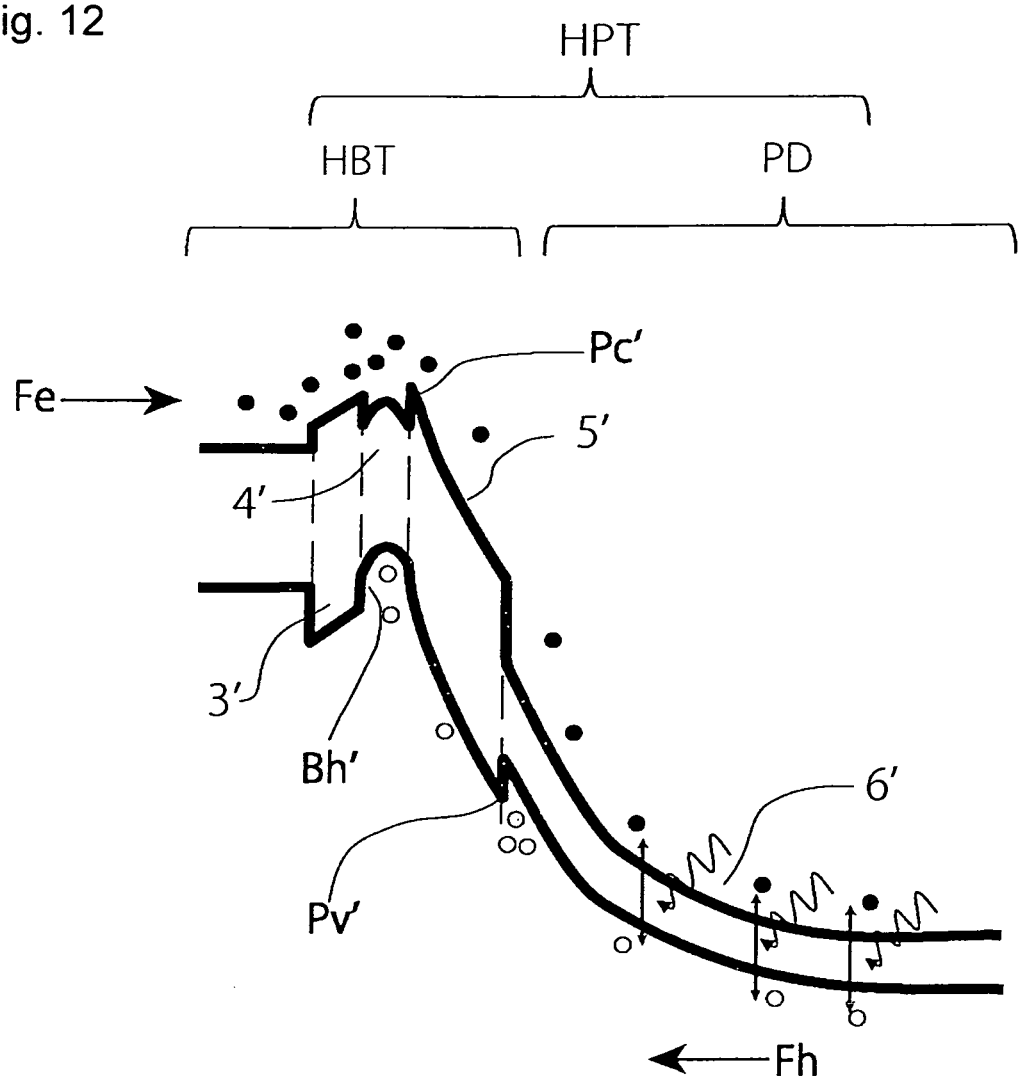
FIG. 12 is the explanatory view of the band profile of HPT of the conventional composition.

A hetero bipolar phototransistor (HPT) is the structure where a photodiode (PD) is stacked on a hetero-bipolar transistor (HBT). FIG. 12 shows the band gap profile of the conventional example, where the photo-absorption layer of a narrow band gap is added to a classical HBT. Previously, it was believed to be preferable that the band gap of the base layer 4' of a hetero-bipolar transistor should be small in order to confine holes efficiently and the band gap of the collector layer 5' should be large in order to keep breakdown voltage higher. However, when a material of a narrow band gap is used for base layer 4', a band offset (barrier) occurs at the conduction band from emitter-layer 3' to collector layer 5' as shown at the interface-position Pc', and the transfer of the electrons along the arrow Fe direction as shown with the black circle is obstructed. Moreover, when the photo-absorption layer 6' of a narrow gap, which has sensitivity in infrared range, is used, a band offset (barrier) occurs at the valence band on the interface-position Pv' between the collector layer 5' and the photo-absorption layer 6'. Therefore, also concerning the holes indicated with the white circle, the flow of the arrow Fh direction is obstructed and sensitivity and transistor amplification characteristics fall remarkably.

On the other hand, in the HPT embodied according to the present embodiment, a barrier-free type band structure without a barrier in the above-mentioned hetero interface as shown in FIG. 1 can be provided. In particular, the collector and barrier layer 5 in the present embodiment comprises a relatively wider gap semiconductor layer than the photo-absorption layer 6. The energy level in the conduction band is higher than that of the photo-absorption layer 6 under it, and the energy level in the valence band is mostly equal to or higher than that of the photo-absorption layer 6. Barriers can be prevented from being generated in a valence band along the interface boundary Pv with the photo-absorption layer 6 by such composition, so that the flow of the holes along the arrow Fh direction is not obstructed. The holes photo-generated in the photo-absorption layer 6 and led to the base layer 4 without being obstructed by a barrier, accumulate at the emitter base junction boundary Bh, and generate a current amplification action by the effect of applying base bias in forward direction.

Moreover, the base layer 4 formed on the collector and barrier layer 5 is a relatively narrow gap as compared with the collector and barrier layer 5, and the energy level in the conduction band is equal to or higher than that of this collector and barrier layer 5 in the interface boundary Pc with the collector and barrier layer 5. Thus, no barrier is generated here. Furthermore, the emitter layer 3 formed on the base layer 4 comprises the first conductivity type semiconductor layer and is a relatively wide gap as compared with the base layer 4. And the energy level in the conduction band is equal to or lower than that of this base layer 4 in the boundary with the base layer 4, and the energy level in the valence band is lower than that of the base layer 4. By doing this, it is possible to make the barrier small in the conduction band in the interface boundary Pc of the base collector junction, and also the electron current in the arrow Fe direction flows toward the photo-absorption layer 6 side without accumulating.

Figure 2A:
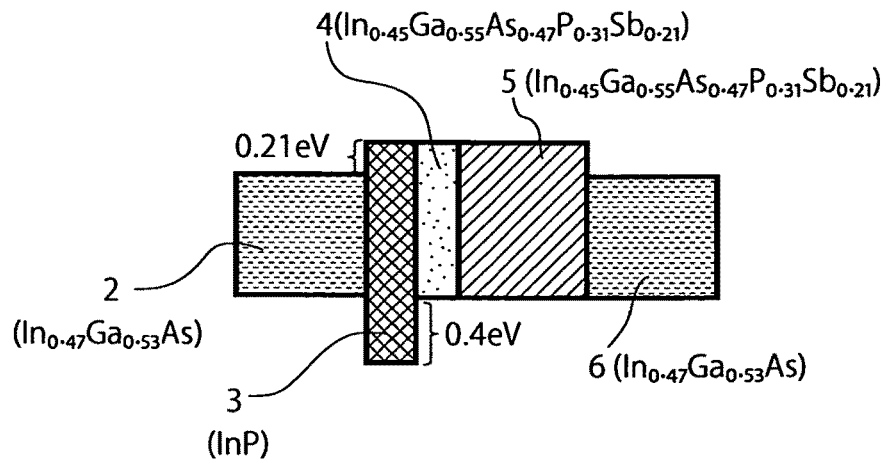
FIG. 2(A) is the schematic view showing the example of material composition for performing one of the preferred embodiment of the present embodiment.
Figure 2B:
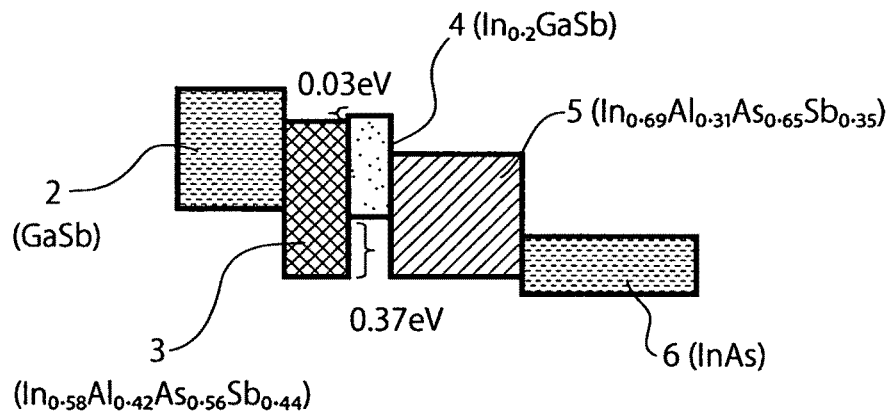
FIG. 2(B) is the schematic view different from FIG. 2(A) showing other examples of preferred material compositions.
Figure 2C:
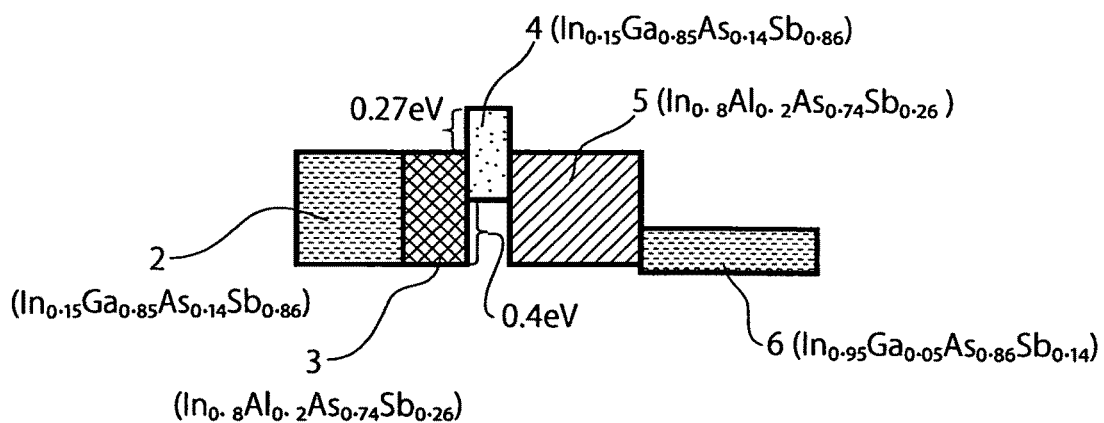
FIG. 2(C) is another schematic view different from FIGS. 2(A) and 2(B) showing another example of preferred material composition.

For example, a barrier-free type band structure as shown in FIG. 1 can be realized by the example of material composition as shown in FIGS. 2(A)-2(C). First of all, when a substrate (not shown) is used as an InP substrate as shown in FIG. 2(A), it is realized by utilizing the lattice-matched $In_{0.47}Ga_{0.53}As$ as the photo-absorption layer 6, and utilizing $In_{0.45}Ga_{0.55}As_{0.47}P_{0.31}Sb_{0.21}$ doped to n type as the collector or a barrier layer 5, and utilizing the base layer 4 doped to p type. The band gap of this compound semiconductor is 0.95 eV, and the conduction band is connected with an InP emitter layer 3, and the valence band is connected with the $In_{0.47}Ga_{0.53}As$ photo-absorption layer 6. In addition to $In_{0.47}Ga_{0.53}As$, $GaAs_{0.5}Sb_{0.5}$, another ternary compound semiconductor lattice-matched to InP is mixed, it enables to perform materials design in terms of the degree of electron affinity in addition to band gap. That is, since the degree of electron affinity of GaAsSb is small, by adjusting compositions of three materials, which are GaAsSb, a large band gap InP, and a small band gap InGaAs, and mixing at a rate of InP:InGaAs:GaAsSb=0.32:0.25:0.43 for example, it is possible to form $In_{0.45}Ga_{0.55}As_{0.47}P_{0.31}Sb_{0.21}$. In addition, when the above-mentioned material is used for the photo-absorption layer 6, the photodetection wavelength becomes about 1.6 micrometers. Moreover, $In_{0.47}Ga_{0.53}As$ is used as the emitter contact layer 2. In addition, the examples of the composition shown in FIGS. 2(B) and 2(C) are explained later.

Figure 3A:
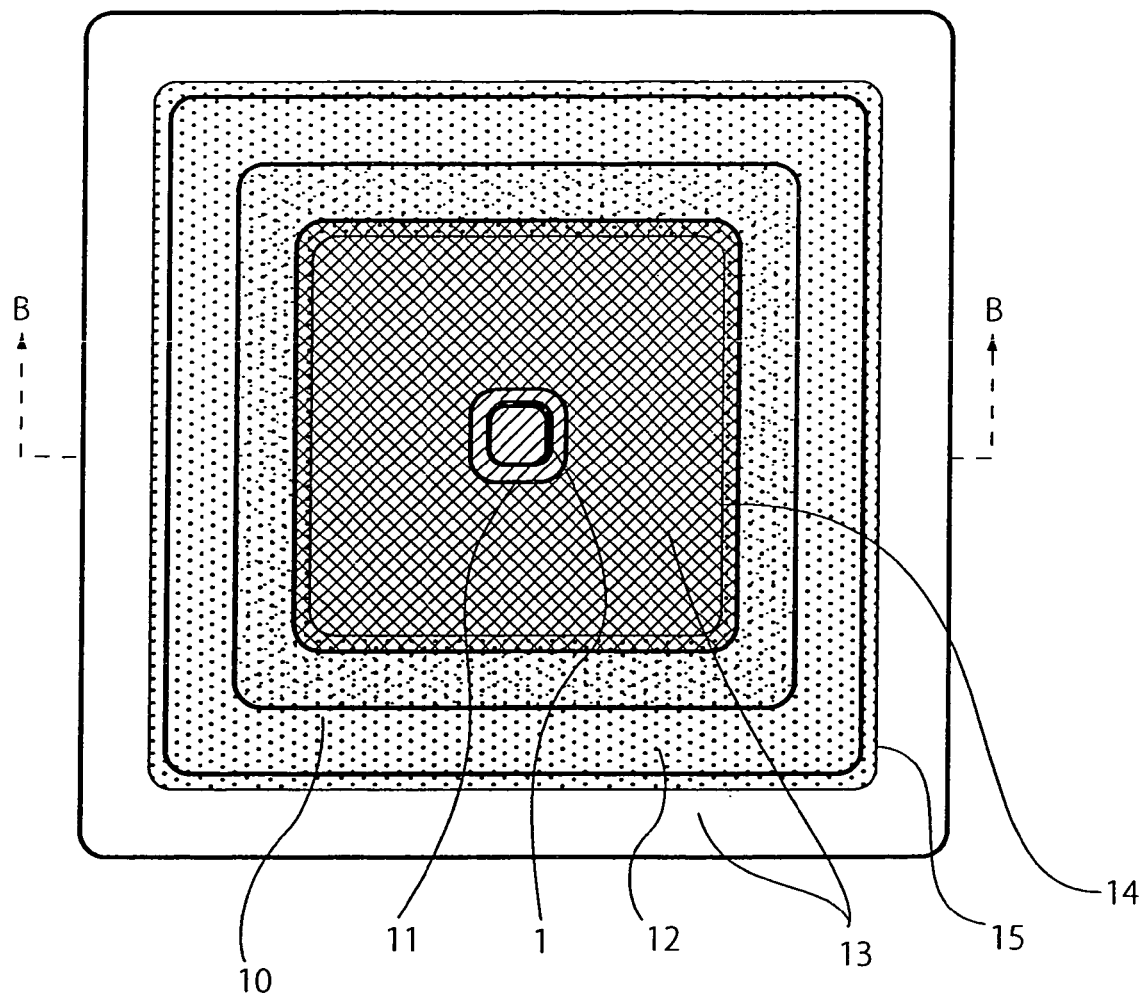
FIG. 3(A) is a schematic plan view showing HPT in the one preferred embodiment of the present embodiment.
Figure 3B:
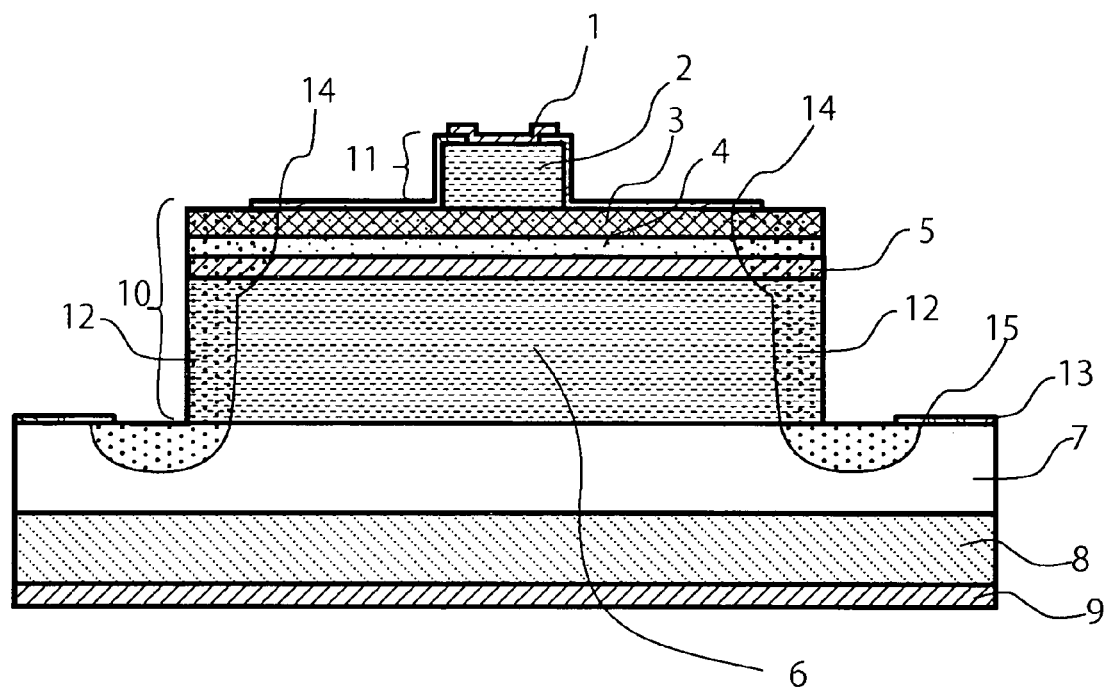
FIG. 3(B) is the cross-sectional view taken along line B-B in FIG. 3(A).

FIGS. 3(A) and 3(B) are one preferred embodiment of the present embodiment HPT with the band structure shown in FIG. 1. FIG. 3(A) is the plan view, and FIG. 3(B) is the cross-sectional view taken along the line B-B in FIG. 3(A). The following layers are stacked: a photo-absorption layer 6 as the first semiconductor layer placed on a substrate 8 with the first conductivity type, for example, an n type compound semiconductor; a collector or a barrier layer 5 of the first conduct type as the second semiconductor layer formed on a photo-absorption layer 6; and further on the a collector or a barrier layer 5, a base layer 4 as the third semiconductor layer of the second conductivity type of opposite polarity to the first conduct type, for example, p type. On the base layer 4, an emitter layer 3 of n-type semiconductor in this case is stacked as the fourth semiconductor layer which has the first conductivity type having a relatively wide gap semiconductor as compared with the base layer 4.

An emitter electrode 1 is formed on the upper region of an emitter layer 3 via an emitter contact layer 2 having high impurity concentration. On the other hand, under the photo-absorption layer 6, which is the first semiconductor layer, there is the wide-gap buffer layer 7, which is n type semiconductor of the first conduct type having a relatively wide gap semiconductor as compared with this photo-absorption layer 6. This is formed on the substrate 8 and the collector electrode 9 contacts the back side of the substrate 8.

A photo-absorption layer 6, a collector and barrier layer 5, a base layer 4, and an emitter layer 3, which are stacked in this order from the substrate to the upper regions, constitute the mesa structure 10 formed into an island shape by mesa etching. Therefore, the sidewall is an exposed side surface exposed along the direction of circumference in space. An emitter contact layer on an emitter layer 3 is also cut out as the second mesa structure 11 by mesa etching, which is smaller than the main mesa structure 10, and is located in the element center position.

From the exposed sidewall of the mesa structure 10 to the inside of the device, the diffusion layer 12 is converted into the semiconductor layer of the second conduct type. This layer is the same conduct type as the base layer 4 using the predetermined impurities within the predetermined distance in transverse direction. By performing like this, the pn junction formed in the device surface, the pn junction 14 of the emitter layer side, and the pn junction 15 of the buffer layer side are to be formed on a small wideband gap semiconductor with very small influence of crystal defects. In the prototype production of the device, the SiNx thin film with a thickness of about 200 nm is formed by plasma CVD method, and Zn is diffused selectively through apertures formed in the SiNx film used as a diffusion mask 13 in the open tube or the closed tube.

Figure 4:
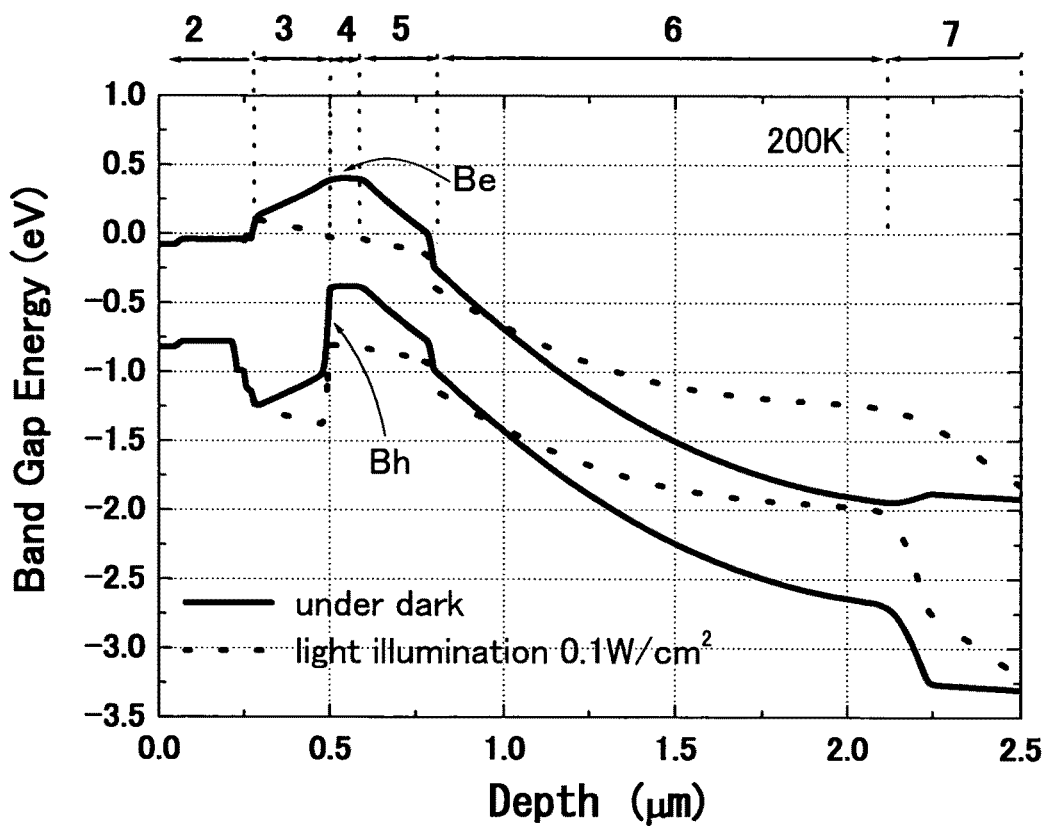
FIG. 4 is a graph of the band profile before and after the light irradiation of a barrier-free type HPT by the material composition shown in FIG. 2 as one preferred embodiment of the present embodiment.

FIG. 4 shows the simulation example of the band structure of the present embodiment, a barrier-free type HPT, which is fabricated to satisfy structure conditions shown in FIGS. 3(A) and 3(B). Its bias voltage is 2V, the photo-absorption layer 6 is 60 μm in diameter, and the emitter contact layer 2 of 4 μm in diameter is formed in the central region. The emitter contact layer 2 is a two-layer structure comprising 100 nm thick n type InGaAs with the career-concentration of $1\times10^{19}$ cm$^{-3}$ and 200 nm thick n type InGaAs with the career-concentration of $1\times10^{18}$ cm$^{-3}$. According to the above-mentioned composition relation shown in FIG. 2(A), the following materials and conditions constitute the layer stacking relation; the emitter layer 3 is InP of 230 nm thick and n type concentration of $1\times10^{16}$ cm$^{-3}$; the base layer 4 is $In_{0.45}Ga_{0.55}As_{0.47}P_{0.31}Sb_{0.21}$ of 100 nm thick and p type concentration of $1\times10^{17}$ cm$^{-3}$; the collector and barrier layer 5 is $In_{0.45}Ga_{0.55}As_{0.47}P_{0.31}Sb_{0.21}$ of 200 nm thick and n type concentration of $1\times10^{15}$ cm$^{-3}$; the photo-absorption layer 6 is n type $In_{0.47}Ga_{0.53}As$ of 1500 nm thick and n type concentration of $1\times10^{15}$ cm$^{-3}$.

The band gap of $In_{0.45}Ga_{0.55}As_{0.47}P_{0.31}Sb_{0.21}$ used for the base layer 4 and the collector and barrier layer 5 is 0.95 eV at room temperature. The conduction band is adjusted to that of InP emitter layer 3, and the valence band is adjusted to that of the $In_{0.47}Ga_{0.51}As$ photo-absorption layer 6 respectively.

Furthermore, the Zn diffusion layer 12 is formed over a depth of 1 micrometer after forming the mesa structures 10 and 11 as shown in FIGS. 3(A) and 3(B). In this simulation, although the surface crystal defect is established, the surface current is effectively blocked by the Zn diffusion from the mesa-structure sidewall.

Between the base layer 4 and the emitter layer 3, a band profile with the barrier Be is formed on the conduction band, and a band profile with the barrier Bh is formed on the valence band. When light is irradiated in the state where the collector electrode 9 is positively biased to the emitter electrode 1, the holes generated in the photo-absorption layer 6 are injected into the surface side receiving the drift field at the base layer 4, and the injected holes are confined in the base layer 4 by the barrier Bh. In this case, the band profile of the base layer 4 drops and that is, the barrier Be, which blocks the electron transfer in the emitter layer 3, becomes small, and electrons are injected from the emitter layer 4, and the majority of them flows into the collector and barrier layer 5 via the base layer 4 without recombining, and finally the holes generated by light irradiation are amplified greatly as electron current.

Figure 11:
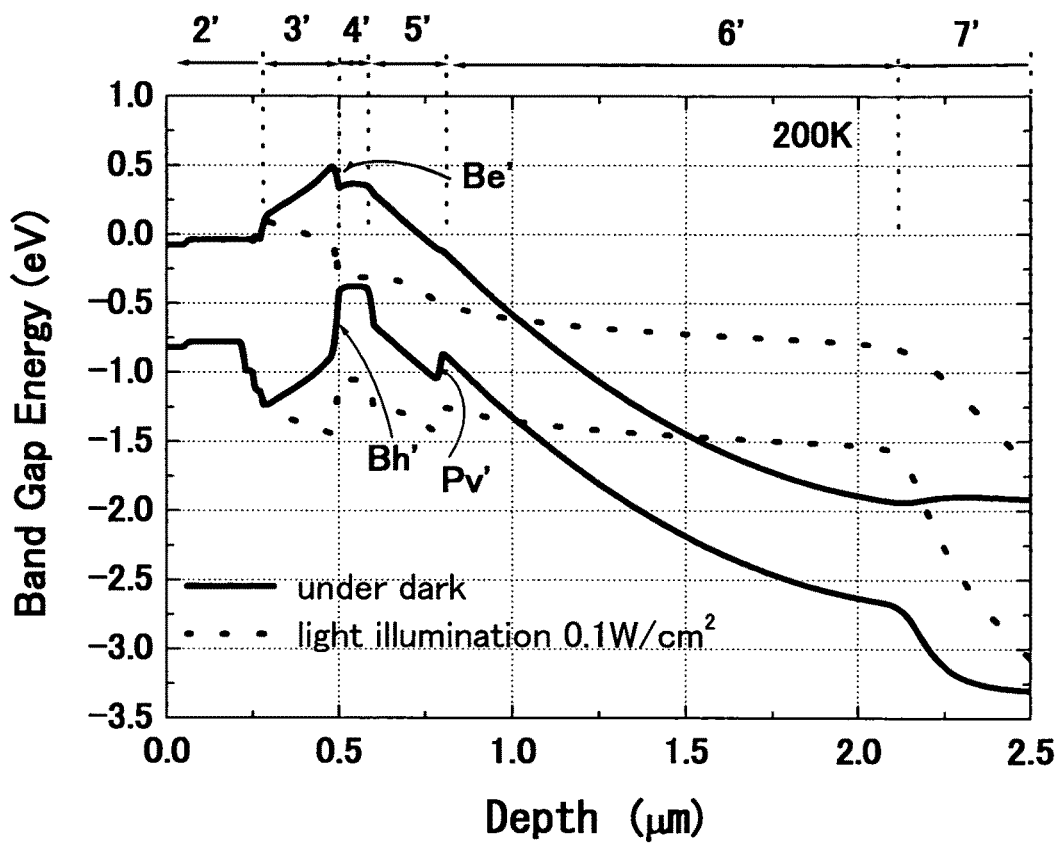
FIG. 11 is a graph of the simulation result concerning the band structure of DH type HPT of the conventional structure.

On the other hand, FIG. 11 shows the simulation result of the band structure of DH type HPT of the conventional structure. The coding is marked with a dash and in correspondence with each layer in the device of the present invention. In particular, the emitter contact layer is code 2', the emitter layer is code 3', the base layer is code 4', the collector layer is code 5', the photo-absorption layer is code 6', and the buffer layer is code 7' respectively. Except the base layer 4', which differs from the present invention, is replaced with $In_{0.86}Ga_{0.28}As_{0.61}P_{0.29}$ of a band gap 0.95 eV, the remaining comprises the same geometry and composition as the present invention shown in FIG. 4. In the case of this conventional structure, the barrier Be is generated between the emitter-layer 3' and the base layer 4' in a conduction band. In the valence band, a barrier is generated at the interface boundary Pv' between the collector layer 5' and the photo-absorption layer 6' so that the valence band is discontinuous. On the other hand, in FIG. 4, those discontinuous points are removed and it becomes barrier-free.

Figure 5:
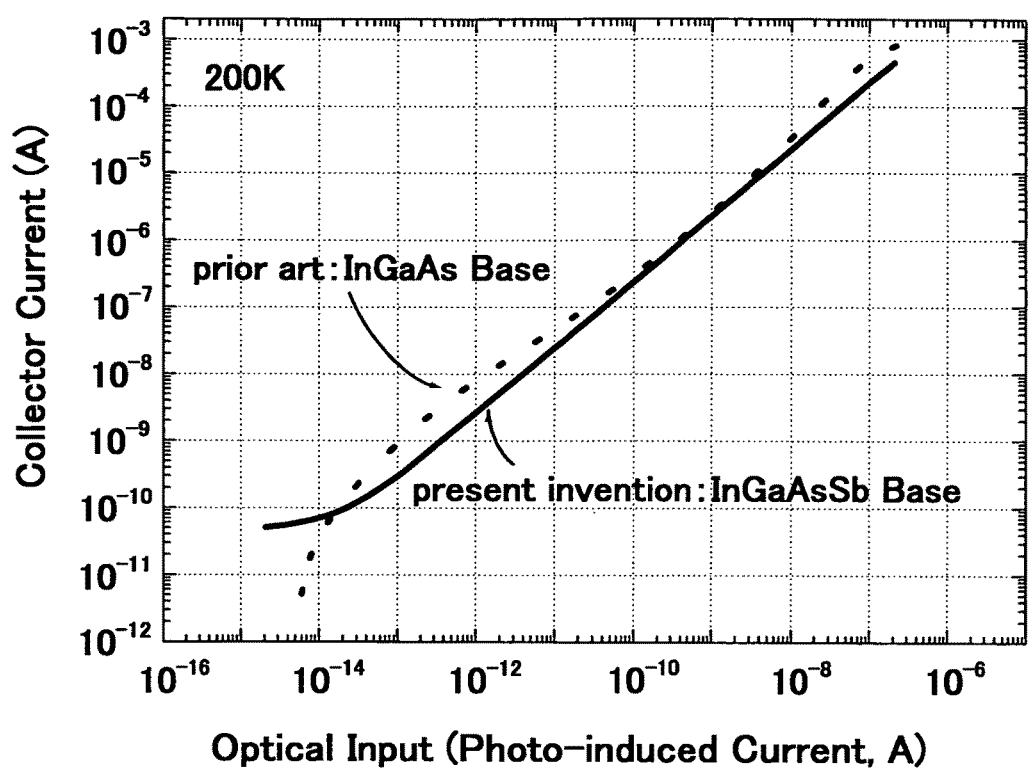
FIG. 5 is a graph showing the comparison between a present embodiment HPT and a conventional structure HPT in terms of optical input and current output characteristics.

FIG. 5 is the graph comparing the current output characteristic with optical input at 200K of the present invention HPT represented in solid line with the conventional structure HPT represented in dashed line. In the present invention HPT, which uses InGaAsSb for a base layer, its current output to an optical input increases linearly from the near 10 fA of induced current which corresponds to about 10 fW of input optical power. While in an HPT of the conventional structure using InGaAs for a base layer, the current output is blocked for less than about 10 fW and linearity of current output vs. input power is disturbed accompanying a few current output inflection points. Thus, in a conventional HPT, the carrier transfer in a transistor region is blocked by the band discontinuity in a hetero interface when the device is cooled in order to reduce the dark current of a PD region so that cooling the device does not contribute to improve sensitivity. On the other hand, according to the present embodiment, the current amplification function of a transistor region is guaranteed even for very weak light input under low-temperature environment, and the detection sensitivity below some femto-watts can be obtained.

Figure 6:
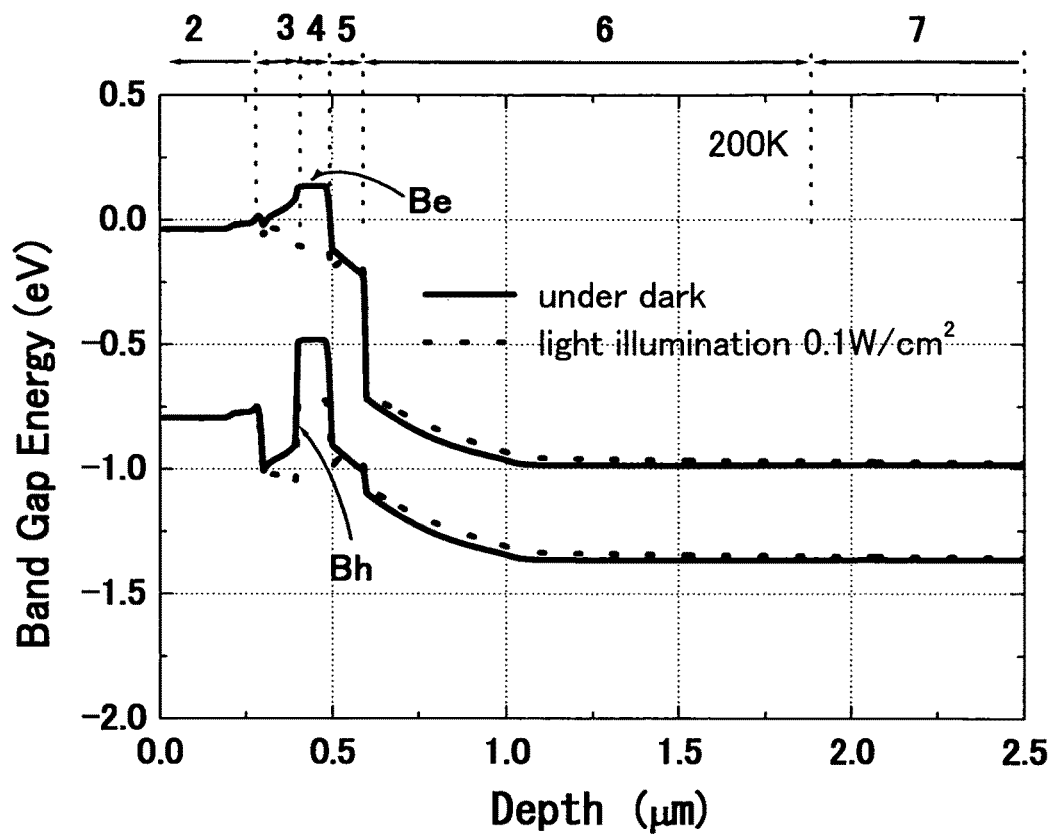
FIG. 6 is a graph of the band profile showing before and after the light irradiation of an HPT using InAs for the photo-absorption layer as another preferred embodiment of the present embodiment.

FIG. 6 shows the band profile extending the detection wavelength range to 3.5 μm by using InAs for a photo-absorption layer 6 according to the example of the material composition shown in FIG. 2(B). In this graph, the solid line represents the band profile for a dark state, and the dashed line represents the band profile for irradiating light intensity of 0.1 W/cm$^2$. Specific material parameters set for performing calculation are as follows: the emitter layer 3 is 100 nm thick, $In_{0.58}Al_{0.42}As_{0.56}Sb_{0.44}$ with n type concentration $2\times10^{16}$ $cm^{-3}$; the base layers 4 are 100 nm thick, $In_{0.2}GaAsSb$ with p type concentration $3\times10^{17}$ $cm^{-3}$; the collector and barrier layer 5 is 100 nm thick, $In_{0.69}Al_{0.31}As_{0.65}Sb_{0.35}$ with n type concentration of $2\times10^{15}$ $cm^{-3}$; and the photo-absorption layer 6 is stacked using 400 nm thick InAs with n type concentration of $2\times10^{15}$ $cm^{-3}$ and 2 μm thick n type InAs with concentration of $2\times10^{16}$ $cm^{-3}$.

Herein, the band gap and the degree of electronic affinity of the emitter layer 3 are 0.95 eV and 4.2 eV respectively. The band gap and the electron affinity of the $In_{0.2}GaAsSb$ base layer 4 are 0.62 eV and 4.17 eV respectively. The band gap and the electron affinity of the collector and barrier layer 5 are 0.75 eV and 4.4 eV respectively. Also, the band gap and the electron affinity of InAs were set as 0.35 eV and 4.9 eV at room temperature in the calculation. Furthermore, when performing calculation, as the dimension of specific HPT shown in FIG. 2(B), the diameter of the second mesa structure containing the emitter contact layer 2 is set to 4 μm, the diameter of the domain portion of the first mesa structure that specifies the base layer 4, i.e., the domain portion, which functions as a practical absorption domain of light by the photo-absorption layer 6, is set to 24 μm. The collector voltage is set to 1 V.

Also in the band gap profile in this figure, the conduction band potential slope along the base layer 4, the collector or a barrier layer 5, and the photo-absorption layer 6 are formed in the direction to accelerate electrons to a substrate except the potential barrier which is formed for controlling collector current at the interface between the emitter layer 3 and the base layer 4. On the other hand, in the valence band, the electric field to accelerate holes in the surface direction is formed in the path from the photo-absorption layer 6 to the base layer 4 via the collector or a barrier layer 5.

Figure 7:
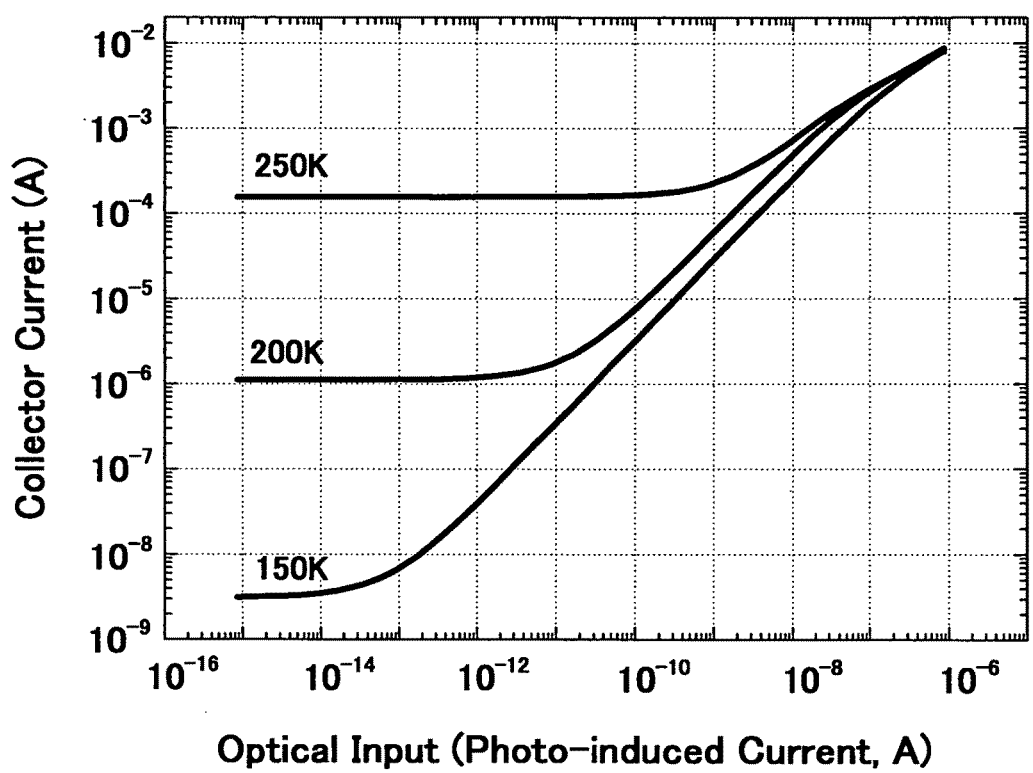
FIG. 7 is a graph showing the temperature dependence of the optical input and the current output characteristics of an HPT shown in FIG. 6.

FIG. 7 indicates that the collector current of the HPT, which has the band profile shown in FIG. 6, is simulated and plotted by taking a device temperature as a parameter against the induced current generated at irradiating light to this HPT. When performing the calculation, as the dimension of specific HPT shown in FIG. 2(B), the diameter of the second mesa structure containing the emitter contact layer 2 is set to 4 micrometers, and the diameter of the first mesa structure is set to 24 micrometers which specifies the base layer 4 functioning as a practical absorption region in the photo absorption layer 6. The collector voltage is set to 1 V. Incidentally, it is obvious that the smaller the size of the second mesa structure is, the wider the area of incident light can expand.

In FIG. 7, when focusing on the calculation result of 200K (about −70° C.), the collector current in the operating point corresponding to the incident light current value $10^{-10}$ A in the InAs photo-absorption layer 6 becomes about $10^{-5}$ A, and the sensitivity of HPT in this example is about $10^5$ A/W. This value is an improvement of more than 2-4 digits compared with the conventional device, for example, disclosed by the above-mentioned Documents 6 and 7.

In addition, when operating environment temperature is lowered further, the generation of electron hole pairs is controlled and dark current decreases greatly. For example, in the operation at 150 K (about −120° C.), dark current decreases to about 2 nA, and the dynamic range for light intensity is also extended by more than 5 digits.

As for a collector or a barrier layer 5, the semiconductor, which has a band gap with little generation of electronic hole pairs at the practical environmental temperature, is selected. For example, if the operation is near the room temperature, the semiconductor having a band gap of 1 eV or more is preferred. Moreover, in order to avoid transferring holes or electrons by the tunneling, setting the thickness to several 10 nm or more is preferred.

In this embodiment, InAs is used for the photo-absorption layer 6 and it is assumed that the absorption wavelength band is up to 3.5 micrometers or so. When making a middle-infrared photodetector with a much longer wavelength, it is desirable to use the semiconductor of an InAsSb system for the photo-absorption layer 6. In this case, the light of the wavelength up to about 5 micrometers is detectable.

Figure 8:
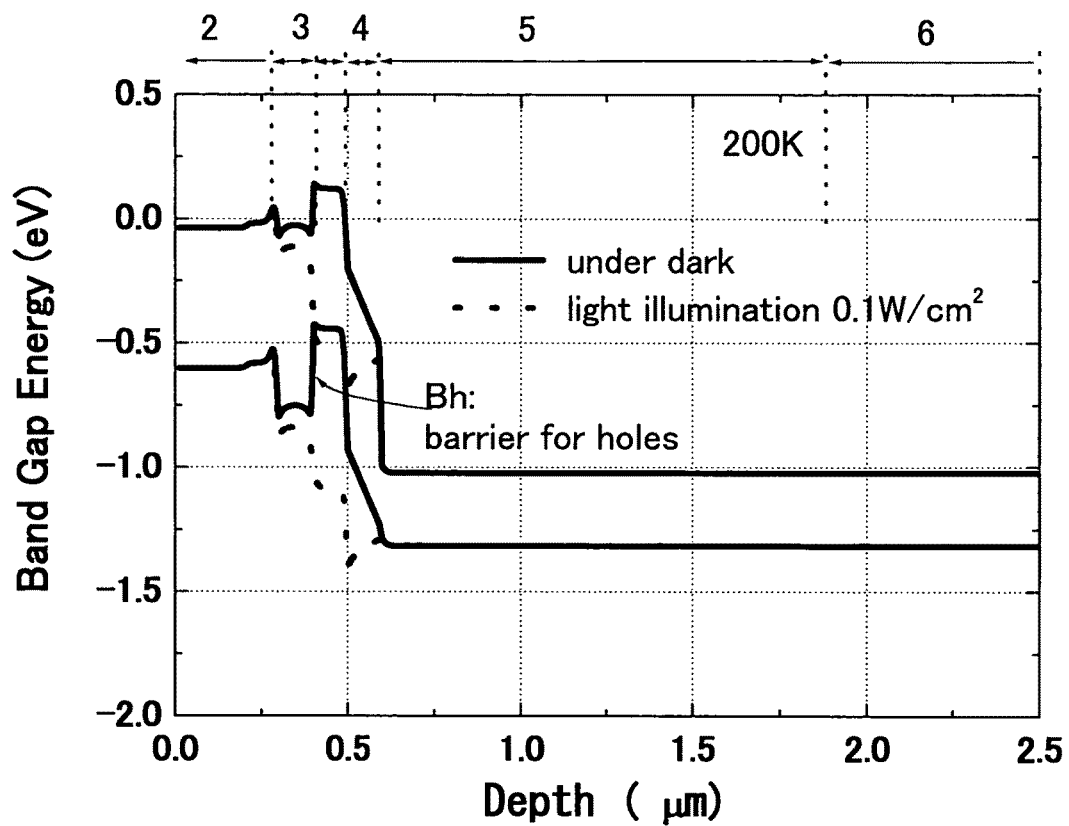
FIG. 8 is a graph of the band profile showing before and after the light irradiation of an HPT using InAs for the photo-absorption layer as another preferred embodiment of the present embodiment.

According to the material composition shown in FIG. 2(C), FIG. 8 shows when the photo-absorption layer 6 uses InGaAsSb, and the band profile is extended to the sensitive wavelength range up to about 5 micrometer. In this chart, the solid line represents the band profile of a dark state, and the dashed line represents the band profile of irradiating light intensity 0.1 $W/cm^2$. The specific material parameter when performing the calculation is as follows: the emitter layer 3 is 100 nm in thick, n type concentration $2\times10^{16}$ $cm^{-3}$ $In_{0.8}Al_{0.2}As_{0.74}Sb_{0.26}$, the base layer 4 is 100 nm thick, p type concentration $3\times10^{17}$ $cm^{-3}$ $In_{0.15}Ga_{0.85}As_{0.14}Sb_{0.86}$, the collector and barrier layer 5 is 100 nm thick, n type concentration $2\times10^{15}$ $cm^{-3}$ $In_{0.8}Al_{0.2}As_{0.74}Sb_{0.26}$ and the photo-absorption layer 6 is 2 micrometer thick, n type concentration $2\times10^{17}$ $cm^{-3}$ $In_{0.95}Ga_{0.05}As_{0.86}Sb_{0.14}$.

In addition, the band gap and the electron affinity of the $In_{0.8}Al_{0.2}As_{0.74}Sb_{0.26}$ emitter layer 3 and the collector or the barrier layer 5 are 0.69 eV and 4.41 eV respectively, and the band gap and the electron affinity of the $In_{0.15}Ga_{0.85}As_{0.14}Sb_{0.86}$ base layer 4 are 0.56 eV and 4.14 eV respectively. In particular, the band gap and electron affinity of $In_{0.95}Ga_{0.05}As_{0.86}Sb_{0.14}$ photo-absorption layer 6 are set to 0.27 eV and 4.88 eV at room temperature for calculation.

Figure 9:
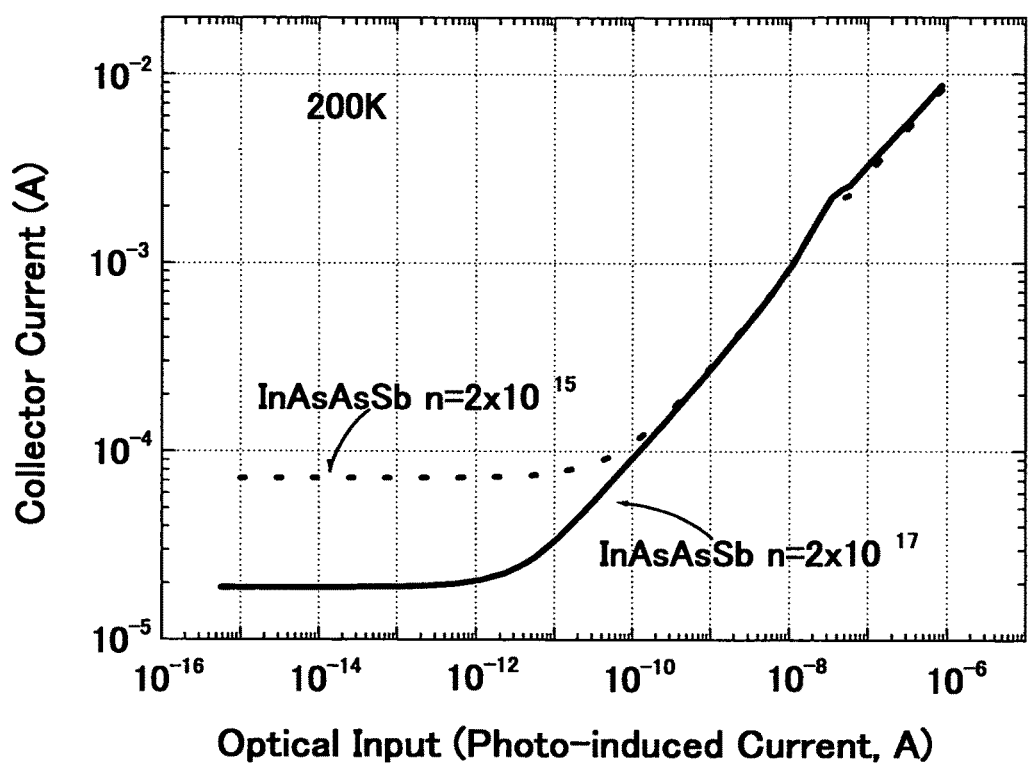
FIG. 9 is a graph of an HPT showing the carrier-concentration dependability of the optical input and the current output characteristics of the InGaAsSb photo-absorption layer shown in FIG. 8.

FIG. 9 is a plot of the photo-induced current inside the device and collector current, setting the photo-absorption layer 6 to n type $In_{0.95}Ga_{0.05}As_{0.86}Sb_{0.14}$ for concentrations of $2\times10^{17}$ $cm^{-3}$ (solid line) and $2\times10^{15}$ $cm^{-3}$ (dashed line) respectively. When the band gap of the photo-absorption layer 6 becomes narrow, it has the tendency of increasing the dark current by the influence of carriers from the heat induction. However, since this device blocks out the electron flow, which is the majority carriers according to the nBn structure, the hole concentration, which is the source of the dark current, decreases by increasing the electron concentration of the photo-absorption layer. Dark current actually decreases by increasing the electron concentration of the photo-absorption layer in FIG. 9.

The following table 1 shows the design example of the epitaxial layer composition of barrier-free (BF) type HPT in the near and middle infrared band and the middle-infrared sensitive wavelength ranges.

TABLE 1

| Wavelength sensitivity area | Emitter | Base | Collector | Light absorbing layer |
|---|---|---|---|---|
| 1.6 μm | InP | InGaAsSb or InAlGaAs | InAsGaAs | $In_{0.53}Ga_{0.47}As$ |
| 2.5 μm | InAlAsSb | InGaAsSb | InGaAsSb | $In_{0.3}Ga_{0.7}As_{0.3}Sb_{0.7}$ |
| 3.5 μm | InAlAsSb | InGaSb | InAlAsSb | InAs |
| 5 μm | InAlAsSb | InGaAsSb | InAlAsSb | $InAs_{0.88}Sb_{0.12}$ or $In_{0.95}Ga_{0.05}As_{0.86}Sb_{0.14}$ |

An InGaAsSb collector layer can be used as a photo-absorption layer for applications to require the sensitivity wavelength up to 2.5 μm. Because the dark current component by thermal excitation increases as the band gap becomes small, it is important to optimize the band gap of the photo-absorption layer according to the operating wavelength. The conduction band is turned into barrier-free concerning its electron transfer by setting the base layer to InGaAsSb and the collector and barrier layer into InAlAsSb system. On the other hand, the valence band can realize the band profile, which serves as barrier-free mostly in the InAlAsSb collector layer and InAs or the InAsSb photo-absorption layer.

Figure 10A:
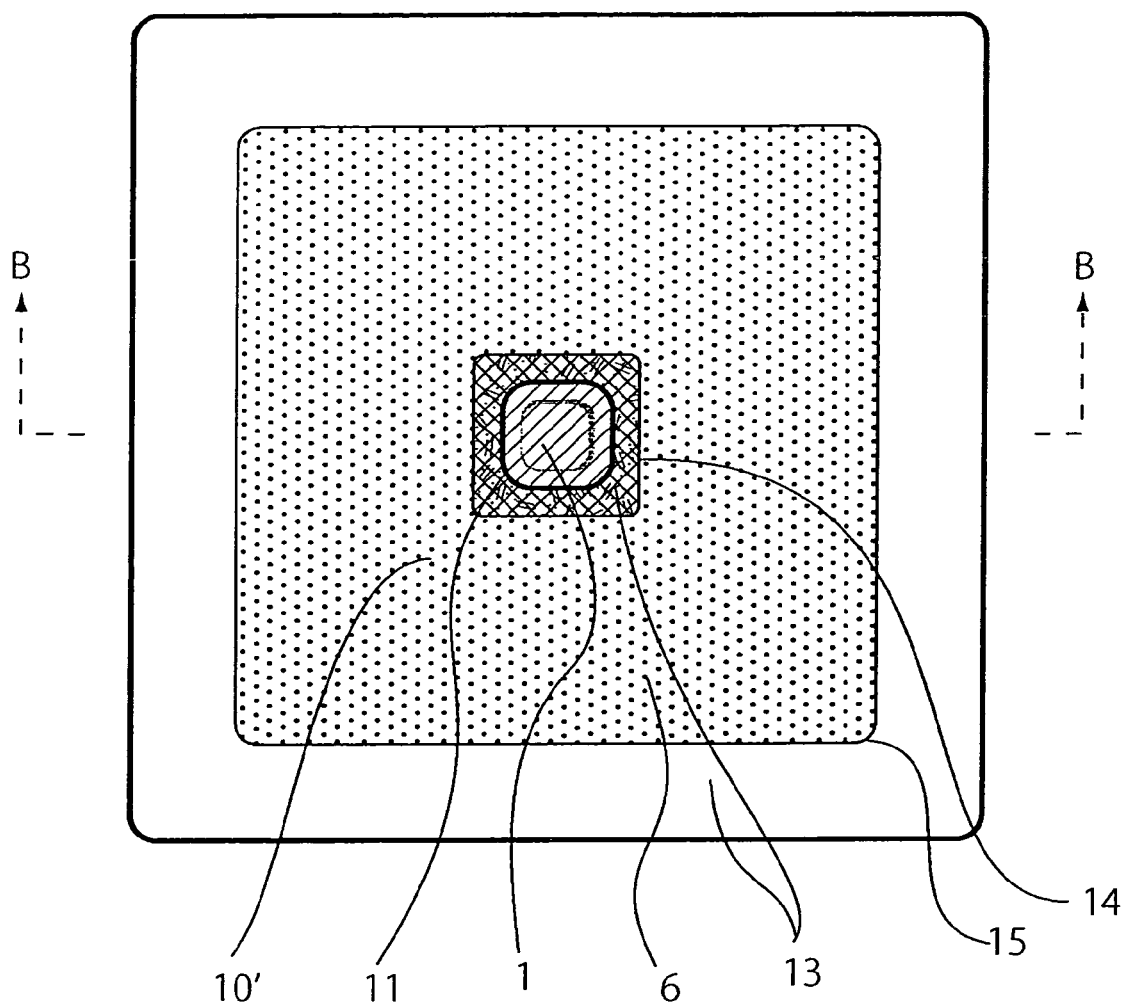
FIG. 10(A) is a schematic plan view of HPT showing the diffusion of impurities in a ring shape around the base layer as another embodiment of the present invention.
Figure 10B:
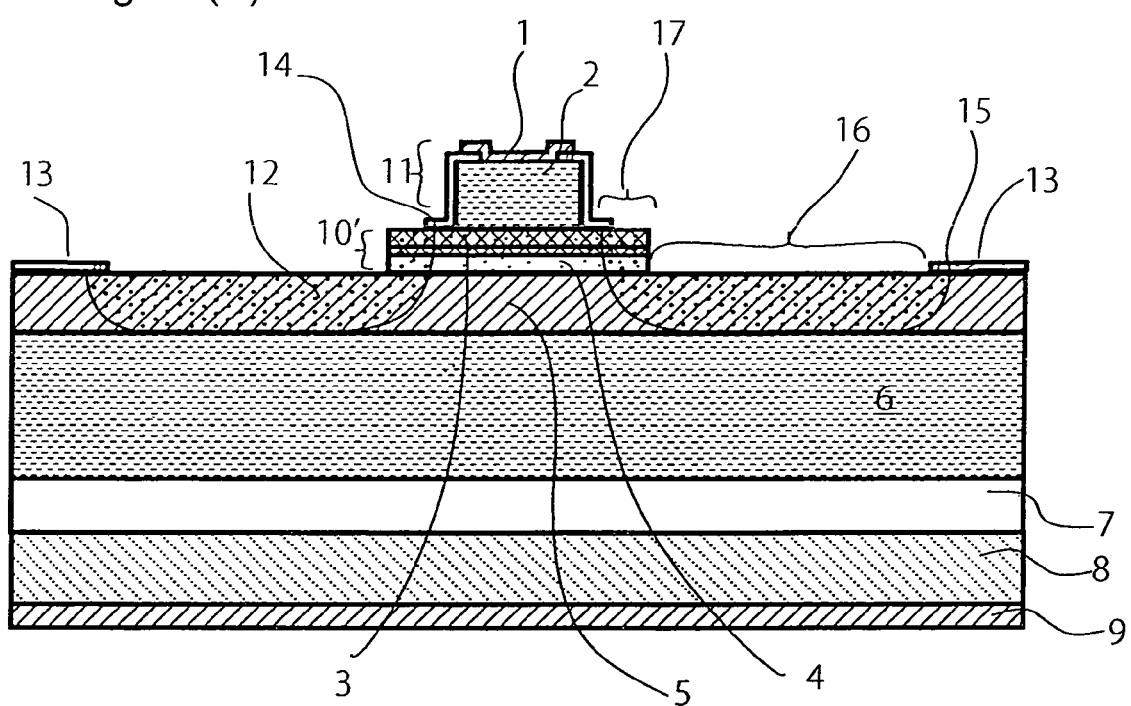
FIG. 10(B) is a cross-sectional view taken along the line B-B in FIG. 10(A).

In order to control the surface current of the PD section, as shown in FIGS. 10(A) and 10(B), the collector exposed surface 16 and the sidewall 17 of the base layer 4 and the emitter layer 3 can be connected electrically by diffusing p type impurity selectively into those surface regions. FIG. 10(A) is a plan view and FIG. 10(B) is the cross-sectional view taken along line B-B in FIG. 10(A). Also in the structure shown in FIG. 3 in this embodiment, the same code is shown in the same or same component. Concerning the items with omitted explanation here, the explanation already made for FIG. 3 can be alternatively used. However, the first mesa-structure 10' comprises the base layer 4 and the emitter layer 3, but excludes the photo-absorption layer 6 and the collector or the barrier layer 5.

In order to control the surface leak current in the structure of this embodiment, the collector layer 5 needs to be a wide-band gap compared to the photo-absorption layer 6. That is, the transistor region of this HPT serves as DH type HBT, and in the conventional structure, the current amplification function in very weak light is obstructed by the hetero barrier between the base and the collector. Moreover, the hetero barrier between the photo-absorption layer 6 and the collector or the barrier layer 5 inhibits the transfer of the photo-generated holes to the base layer 4. Therefore, by using the material system shown in the above Table 1 for the base layer 4, the collector operating as the barrier layer 5, and the photo-absorption layer 6, the conduction band level of the base layer 4 can be raised, and the valence band of the photo-absorption layer 6 and the collector operating as the barrier layer 5 can be aligned, so that an HPT with excellent breakdown voltage and reduced dark current is realized. In fact, even in the HPT of this embodiment, by selecting each composition relations according to the present embodiment, the barrier of the base layer disappears and becomes barrier-free, which bring good conduction state under light irradiation. However, since the transfer of electrons or holes will be obstructed by the small band discontinuity when the device temperature falls, it is preferable to use together the graded composition structure, which the composition of the hetero interface changes gradually.

Concerning the built-in potential of an emitter base junction, it is suitable to be about 10 times of the thermal energy kT corresponding to the used device temperature. That is, since kT in room temperature is 25 meV, the built-in potential of an emitter base junction of about 0.25 eV is suitable for devices used at room temperature. While, as device temperature is lowered, the potential barrier has to be lowered in order to secure the output current. In general, the turn-on voltage of the pn junction becomes almost equal to the band gap of the material which forms the junction, so that it is necessary to narrow the band gap of the material which forms the junction in order to reduce this turn-on voltage. However, a narrow band-gap material generally has large recombination rate, and the control of dark current and the reservation of current gain become difficult. In addition, the base layer 4 of an HPT shown in FIGS. 10(A) and 10(B) can be p type or n type semiconductor layer which makes the conduction band high.

Moreover, the present invention HPT so far described of the constructional example in which the second mesa structure 11 is arranged in the central region of the first mesa structure 10 (10'). However, the second mesa structure 11 can be formed in the region (a peripheral region) of the first mesa structure 10 (10'), or the second mesa structure 11 can be divided and formed in multiple places.

What is claimed is:
1. A hetero junction bipolar phototransistor, comprising:
a photo-absorption layer formed of a first conductivity type semiconductor layer, and a collector operating as a barrier layer, a base layer, and an emitter layer, which are in direct contact with each other in sequence on the photo-absorption layer,
wherein said photo-absorption layer, said collector operating as the barrier layer, said base layer and said emitter layer forming a first mesa structure, and an emitter contact layer forming a second mesa structure form the phototransistor;
said photo-absorption layer comprises a semiconductor layer with a narrow bandgap corresponding to a light-sensing wavelength of the phototransistor wherein an energy level in a conduction band edge of the photo-absorption layer is lower than an energy level in a conduction band edge of the collector operating as the barrier layer, and an energy level in a valence band edge of the photo-absorption layer is equal to or less than an energy level of a valence band edge of the collector operating as the barrier layer;
said collector operating as the barrier layer essentially consists of a semiconductor layer of single material composition with a relatively wider bandgap than a bandgap of said photo-absorption layer where the energy level in the conduction band edge is higher than the energy level of said photo-absorption layer in the conduction band edge, and the energy level in the valence band edge is equal to or higher than the energy level of said photo-absorption layer in the valence band edge;
said base layer formed on said collector operating as the barrier layer has an energy level in a conduction band edge which is equal to or higher than the energy level in the conduction band edge of the collector operating as the barrier layer;
said emitter layer formed on the base layer has a relatively wide bandgap as compared to said base layer, and an energy level in a valence band of the emitter layer is lower than an energy level in a valence band of the base layer; and
said photo-absorption layer comprises InGaAs, and said collector operating as the barrier layer comprises InGaAsPSb, and said base layer comprises InGaAsPSb.

* * * * *